United States Patent
Ho et al.

(10) Patent No.: US 9,166,160 B1
(45) Date of Patent: Oct. 20, 2015

(54) RESISTIVE RANDOM ACCESS MEMORY AND METHOD OF FABRICATING THE SAME

(71) Applicant: Winbond Electronics Corp., Taichung (TW)

(72) Inventors: Chia-Hua Ho, Taichung (TW); Shuo-Che Chang, Taichung (TW); Hsiu-Han Liao, Hsinchu (TW); Po-Yen Hsu, New Taipei (TW); Meng-Hung Lin, Taichung (TW); Bo-Lun Wu, Changhua County (TW); Ting-Ying Shen, Chiayi (TW)

(73) Assignee: Winbond Electronics Corp., Taichung (TW)

( * ) Notice: Subject to any disclaimer, the term of this patent is extended or adjusted under 35 U.S.C. 154(b) by 0 days.

(21) Appl. No.: 14/481,925

(22) Filed: Sep. 10, 2014

(30) Foreign Application Priority Data

Apr. 2, 2014 (TW) .............................. 103112331 A

(51) Int. Cl.
*H01L 47/00* (2006.01)
*H01L 21/20* (2006.01)
*H01L 45/00* (2006.01)

(52) U.S. Cl.
CPC ............ *H01L 45/1253* (2013.01); *H01L 45/08* (2013.01); *H01L 45/16* (2013.01)

(58) Field of Classification Search
CPC ...... H01L 45/1253; H01L 45/08; H01L 45/16
USPC ................................ 257/2, 5; 338/20; 438/384
See application file for complete search history.

(56) References Cited

U.S. PATENT DOCUMENTS

| | | |
|---|---|---|
| 8,067,762 B2 | 11/2011 | Ho et al. |
| 8,575,586 B2 | 11/2013 | Lee |
| 8,587,983 B2 | 11/2013 | Ho et al. |
| 2007/0120106 A1 | 5/2007 | Hayakawa et al. |
| 2009/0102598 A1 | 4/2009 | Yamazaki et al. |
| 2011/0085368 A1 | 4/2011 | Kim et al. |
| 2011/0291066 A1 | 12/2011 | Baek et al. |
| 2012/0248400 A1* | 10/2012 | Yu et al. ........................... 257/5 |
| 2012/0292588 A1 | 11/2012 | Fujii et al. |
| 2012/0313067 A1* | 12/2012 | Lee et al. ......................... 257/2 |
| 2013/0134383 A1 | 5/2013 | Hwang et al. |
| 2013/0214236 A1 | 8/2013 | Lu et al. |

FOREIGN PATENT DOCUMENTS

| | | |
|---|---|---|
| DE | 102008032067 | 1/2009 |
| JP | 2008288436 | 11/2008 |

(Continued)

OTHER PUBLICATIONS

"Office Action of Taiwan Counterpart Application", issued on Jun. 22, 2015, p. 1-p. 5.

(Continued)

*Primary Examiner* — David S Blum
(74) *Attorney, Agent, or Firm* — Jianq Chyun IP Office

(57) ABSTRACT

Provided is a resistive random access memory including a first electrode layer, a second electrode layer, and a variable resistance layer disposed between the first electrode layer and the second electrode layer, wherein the second electrode layer includes a first sublayer, a second sublayer, and a conductive metal oxynitride layer disposed between the first sublayer and the second sublayer.

10 Claims, 3 Drawing Sheets

(56) References Cited

FOREIGN PATENT DOCUMENTS

| | | | | |
|---|---|---|---|---|
| KR | 1020120022218 | 3/2012 | | |
| TW | 200901376 | 1/2009 | | |
| TW | 201334120 A | * 8/2013 | .......... | H01L 21/8238 |
| TW | 201334121 | 8/2013 | | |

OTHER PUBLICATIONS

"Office Action of Europe Counterpart Application", issued on Aug. 7, 2015, p1-p6, in which the listed reference 1-4 were cited.

"Office Action of Korea Counterpart Application", issued on Aug. 19, 2015, p1-p7, in which the listed reference 5 was cited.

* cited by examiner

RESISTIVE RANDOM ACCESS MEMORY AND METHOD OF FABRICATING THE SAME

CROSS-REFERENCE TO RELATED APPLICATION

This application claims the priority benefit of Taiwan application serial no. 103112331, filed on Apr. 2, 2014. The entirety of the above-mentioned patent application is hereby incorporated by reference herein and made a part of this specification.

BACKGROUND OF THE INVENTION

1. Field of the Invention

The invention relates to a memory and a method of fabricating the same, and more particularly, to a resistive random access memory and a method of fabricating the same.

2. Description of Related Art

Due to high memory density, fast operating speed, low power consumption, and low costs, the resistive random access memory has become an extensively studied memory device in recent years. The principle of operation thereof is that conductive paths are generated by some dielectric materials therein when a high voltage is applied. As a result, the dielectric materials are changed from a high resistance state to a low resistance state, and can return to the high resistance state through a "reset" step thereafter. Accordingly, the dielectric materials can provide the two different states corresponding to "0" and "1", and can therefore be used as a memory unit for storing digital information.

In various resistive random access memories, the hafnium oxide-based resistive random access memory is highly anticipated due to good durability and high switching speed. However, it is often difficult to maintain the currently used titanium/hafnium oxide (Ti/HfO$_2$)-based resistive random access memory in a low resistance state at high temperature, thus causing deterioration of the so-called "high-temperature data retention". In this regard, research and improvements are necessary.

SUMMARY OF THE INVENTION

Technical Issue to be Solved

The invention provides a resistive random access memory and a method of fabricating the same capable of alleviating the issue of high-temperature data retention fail of the resistive random access memory.

Technical Solution

A resistive random access memory of the invention includes a first electrode layer, a second electrode layer, and a variable resistance layer disposed between the first electrode layer and the second electrode layer, wherein the second electrode layer includes a first sublayer, a second sublayer, and a conductive metal oxynitride layer disposed between the first sublayer and the second sublayer.

In an embodiment, the metal in the metal oxynitride layer is any one selected from the group consisting of tantalum (Ta), titanium (Ti), tungsten (W), hafnium (Hf), nickel (Ni), aluminum (Al), vanadium (V), cobalt (Co), zirconium (Zr), and silicon (Si). Preferably, the metal at least includes Ta or Ti.

In an embodiment, the atomic ratio of each of nitrogen and oxygen in the metal oxynitride layer is respectively 5% to 30% and 20% to 60%.

In an embodiment, the atomic ratio of oxygen in the metal oxynitride layer is 45% to 60%.

In an embodiment, the metal oxynitride layer has a polycrystalline structure.

In an embodiment, the thickness of the metal oxynitride layer is between 5 nm and 30 nm.

In an embodiment, the first sublayer is in contact with the variable resistance layer, the material of the first sublayer includes Ti, and the number ratio of oxygen/titanium in the first sublayer is greater than 0.5.

A method of fabricating a resistive random access memory of the invention includes the following steps. A first electrode layer and a second electrode layer are formed on a substrate. A variable resistance layer is formed between the first electrode layer and the second electrode layer, wherein the second electrode layer includes a first sublayer, a conductive metal oxynitride layer, and a second sublayer disposed on the variable resistance layer in sequence.

In an embodiment, the first sublayer includes Ti, and the fabrication method further includes performing a heating step so as to diffuse oxygen in the metal oxynitride layer into the first sublayer such that the number ratio of oxygen/titanium in the first sublayer is greater than 0.5.

Beneficial Effects

Based on the above, the invention provides a resistive random access memory and a method of fabricating the same, wherein a metal oxynitride layer is disposed between the electrode layers. The metal oxynitride layer is used as an oxygen diffusion barrier layer limiting the movement of oxygen ions to the variable resistance layer and the region between the variable resistance layer and the metal oxynitride layer. At the same time, when the resistive random access memory is in a low resistance state thereof, the metal oxynitride layer can also reduce the probability of the oxygen ions diffusing back to the variable resistance layer, thereby increasing the high-temperature data retention of the resistive random access memory.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Exemplary embodiments of the invention are more comprehensively described in the following with reference to figures. However, the invention can be embodied in different forms, and is not limited to the embodiments described in the present text.

Figure 1:
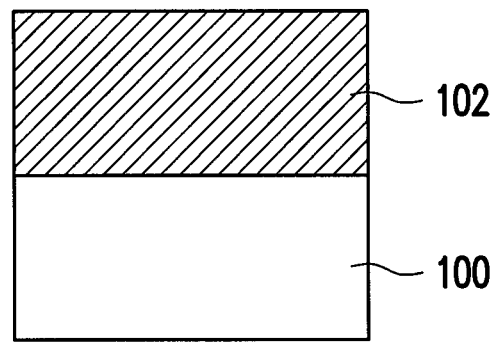
FIG. 1 to FIG. 3 are cross-sectional flow charts illustrating a process of fabricating a resistive random access memory illustrated according to a first embodiment of the invention.

Referring to FIG. 1, first, a substrate 100 is provided. The material of the substrate 100 is not particularly limited, and common materials include, for instance, a semiconductor substrate such as a silicon substrate. Although not shown in FIG. 1, other devices may have been formed in the substrate 100. For instance, a semiconductor device such as a diode or a transistor or a conductive plug connected to different devices can be formed in the substrate 100. The semiconductor device such as a diode or a transistor can be used as a switching device of the resistive random access memory, and can be electrically connected to the structure described in FIG. 2 to FIG. 3 through a conductive plug.

Then, a first electrode layer 102 is formed on the substrate 100. The material of the first electrode layer 102 is not particularly limited, and any known conductive material can be used. For instance, the material can be titanium nitride (TiN), thallium nitride (TaN), titanium aluminum nitride (TiAlN), a titanium tungsten (TiW) alloy, tungsten (W), ruthenium (Ru), platinum (Pt), iridium (Ir), graphite, or a mixture or a stacked layer of the materials. In particular, TiN, TaN, Pt, Ir, graphite, or a mixture thereof is preferred. The method of forming the first electrode layer 102 is not particularly limited, and common methods include, for instance, a physical vapor deposition process such as direct current sputtering or radio frequency magnetron sputtering. The thickness of the first electrode layer 102 is not limited, but is generally between 5 nm and 500 nm.

Figure 2:
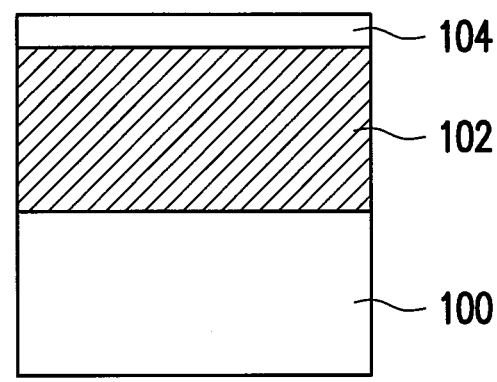

Referring to FIG. 2, next, a variable resistance layer 104 is formed on the first electrode layer 102. The material of the variable resistance layer 104 is not particularly limited. Any material for which the resistance can be changed through the application of a voltage can be used, and common materials include, for instance, hafnium oxide ($HfO_2$), magnesium oxide (MgO), nickel oxide (NiO), niobium oxide ($Nb_2O_5$), titanium oxide ($TiO_2$), aluminum oxide ($Al_2O_3$), vanadium oxide ($V_2O_5$), tungsten oxide ($WO_3$), zinc oxide (ZnO), and cobalt oxide (CoO). The variable resistance layer 104 can be formed by a PVD or a chemical vapor deposition (CVD) process. Alternatively, since the thickness of the variable resistance layer 104 is generally limited to a very thin range (such as 2 nm to 10 nm), the variable resistance layer 104 can also be formed by an atomic layer deposition process.

Figure 3:
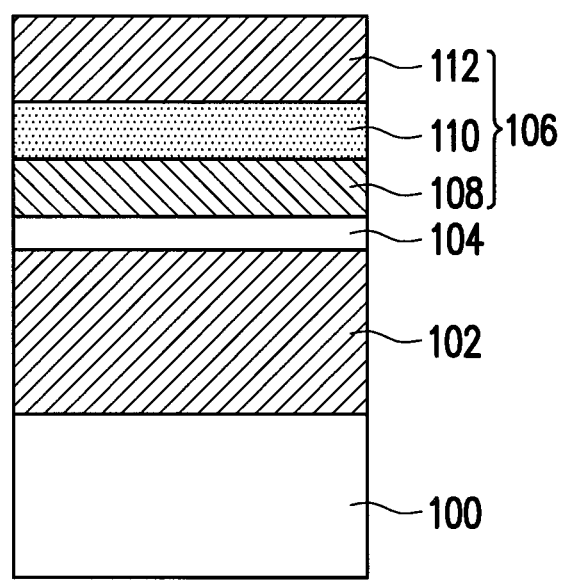

Referring to FIG. 3, then, a second electrode layer 106 is formed on the variable resistance layer 104, wherein the second electrode layer 106 includes a first sublayer 108, a conductive metal oxynitride layer 110, and a second sublayer 112 disposed on the variable resistance layer 104 in sequence.

The material of the first sublayer 108 can be a material more readily bonded with oxygen in comparison to the variable resistance layer 104, and examples thereof include titanium (Ti), tantalum (Ta), zirconium (Zr), hafnium (Hf), aluminum (Al), nickel (Ni), or an incompletely oxidized metal oxide of the metals. The forming method of the first sublayer 108 is not particularly limited, and can include, for instance, a physical or chemical vapor deposition process. The thickness of the first sublayer 108 is also not particularly limited, but is generally between 5 nm and 50 nm.

The metal oxynitride layer 110 can include a material represented by $MN_xO_y$, wherein M can be Ta, Ti, W, Hf, Ni, Al, Va, Co, Zr, or Si, and is preferably Ta or Ti. In the $MN_xO_y$ material, the atomic ratio of N is preferably between 5% and 30%, and the atomic ratio of O is preferably between 20% and 60%, more preferably between 45% and 60%.

In the case that the material of the metal oxynitride layer 110 is $TiN_xO_y$, the forming method thereof can include directly forming a $TiN_xO_y$ thin film through a PVD method. Alternatively, a Ti or TiN thin film can also be first formed, and then the $TiN_xO_y$ thin film is obtained by applying an annealing treatment to the thin film in a $N_2O$ gas environment or applying a $N_2O$ plasma treatment to the thin film.

It should further be mentioned that, the metal oxynitride layer 110 is conductive, and even if the thickness thereof is slightly greater, the overall electrical conductivity of the second conductive layer 106 is unaffected. Therefore, in comparison to the disposition of other dielectric layers, in terms of the metal oxynitride layer 110, the thickness thereof does not need to be strictly limited (for instance, the thickness does not need to be limited to the level of a few nanometers). The thickness thereof can be between, for instance, 5 nm and 30 nm.

Moreover, the metal oxynitride layer 110 can have a polycrystalline structure.

The material and the forming method of the second sublayer 112 can be similar to the first electrode layer 102 and are not repeated herein. The thickness thereof can also be close to the first electrode layer 102, and is preferably between 20 nm and 50 nm.

After the second electrode layer 106 is formed, the fabrication of the resistive random access memory is preliminary complete. Next, if high potential difference is established between the first electrode layer 102 and the second electrode layer 106, then oxygen ions ($O^{2-}$) in the variable resistance layer 104 leave the variable resistance layer 104 and enter the first sublayer 108 due to attraction from a positive potential. As a result, conductive filaments formed by oxygen vacancies are formed inside the variable resistance layer 104, and the resistive random access memory is thereby converted from a high resistance state to a low resistance state.

It should be mentioned that, in a subsequent process (such as a packaging process), a high-temperature treatment is performed on the structure shown in FIG. 3 such that oxygen in the metal oxynitride layer 110 is diffused into the first sublayer 108, and oxygen in the variable resistance layer 104 may also be diffused into the first sublayer 108 at the same time, thereby increasing the number ratio of oxygen/titanium (the material of the first sublayer 108 is exemplified by titanium) in the first sublayer 108. For instance, the oxygen/titanium ratio may be greater than 0.35, greater than 0.5, or even be greater than 0.6. The effect of increased oxygen content is described below with reference to FIG. 4.

Moreover, although the first electrode layer 102, the variable resistance layer 104, and the second electrode layer 106 are formed on the substrate 100 in sequence in the above as an example, those having ordinary skill in the art should understand that the invention is not limited to the particular sequence. In other embodiments, the electrode layer including two sublayers and the metal oxynitride layer can also be first formed on the substrate. Next, the variable resistance layer is formed on the electrode layer, and then the other electrode layer is formed on the variable resistance layer.

The second embodiment of the invention relates to a resistive random access memory that is explained below with reference to FIG. 3.

The resistive random access memory of the invention includes a first electrode layer 102, a second electrode layer 106, and a variable resistance layer 104 disposed between the first electrode layer 102 and the second electrode layer 106, wherein the second electrode layer 106 includes a first sublayer 108, a second sublayer 112, and a conductive metal oxynitride layer 110 disposed between the first sublayer 108 and the second sublayer 112. In the embodiment shown in FIG. 3, the first sublayer 108 is in contact with the variable resistance layer 104. In the case that the material of the first sublayer 108 includes Ti, the number ratio of oxygen/titanium in the first sublayer 108 is preferably greater than 0.5.

The resistive random access memory of the present embodiment has better high-temperature data retention and has better cyclic bearing capacity. A possible mechanism thereof is described below.

Figure 4:
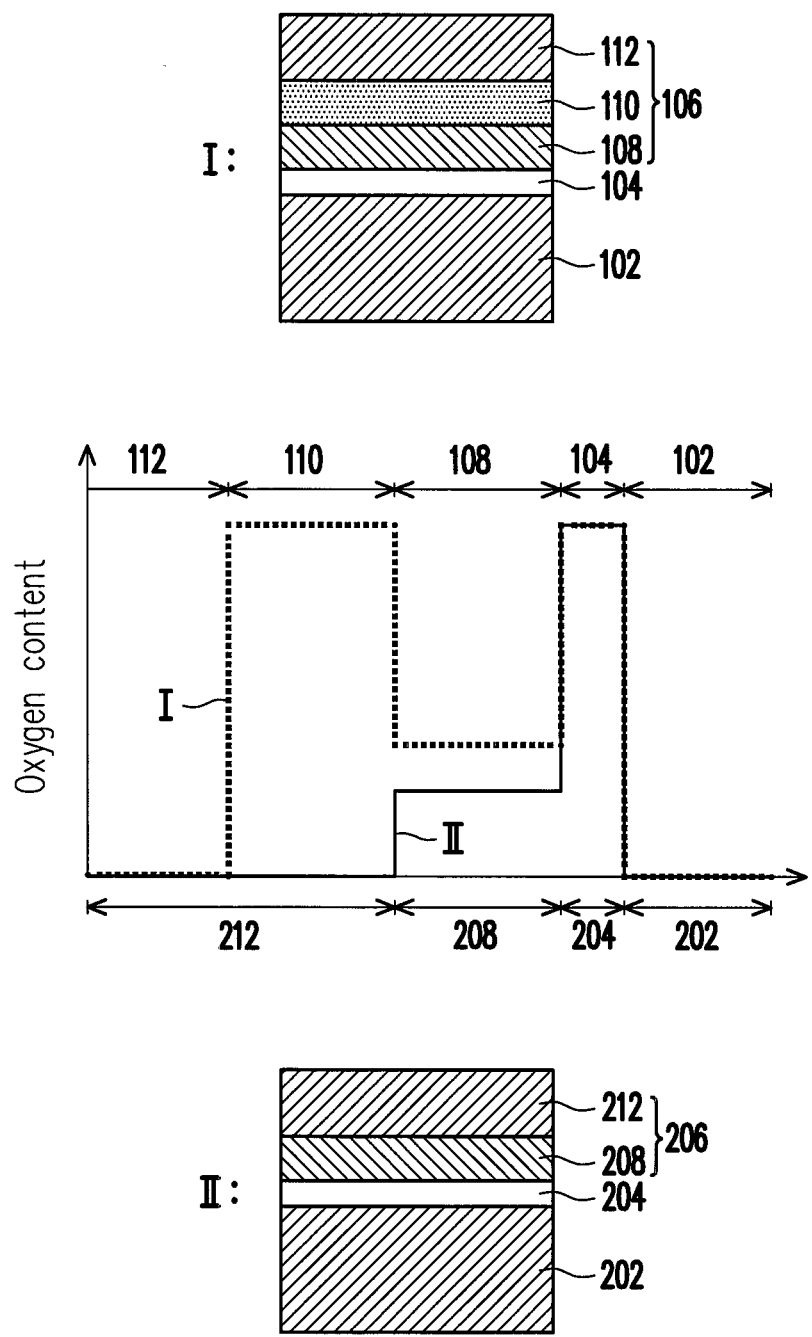
FIG. 4 shows a distribution diagram of oxygen content varying with different positions in a resistive random access memory of a second embodiment of the invention and a known resistive random access memory.

FIG. 4 shows a distribution curve of oxygen content in two different resistive random access memories. In particular, curve I corresponds to the resistive random access memory of the second embodiment of the invention, and curve II corresponds to a known resistive random access memory. The beneficial effects of the resistive random access memory of the invention are described below with reference to FIG. 4.

The known resistive random access memory includes a first electrode layer 202, a second electrode layer 206, and a variable resistance layer 204 disposed therebetween, and the second electrode layer 206 includes a first sublayer 208 and a second sublayer 212. For comparison, the description for FIG. 4 is based on the assumption that the first electrode layer 202, the variable resistance layer 204, the first sublayer 208, and the second sublayer 212 are respectively the same as the first electrode layer 102, the variable resistance layer 104, the first sublayer 108, and the second sublayer 112 of FIG. 3.

As described above, in general, the operating principles of the resistive random access memory involve forming conductive filaments formed by oxygen vacancies in the variable resistance layer through the movement of oxygen ions and thereby converting the originally insulated dielectric material into a low resistance state. Using the known resistive memory illustrated in FIG. 4 as an example, when a voltage is applied thereto, oxygen ions enter the first sublayer 208 from the variable resistance layer 204. However, a long-enduring issue of the prior art is that after a plurality of writings are performed on the resistive random access memory, oxygen ions may cross the first sublayer 208 and enter the second sublayer 212, and not be able to return into the variable resistance layer 204, thus causing the device to fail.

It can be known by observing curve I and curve II of FIG. 4 that, the main difference between the invention and prior art is that, through the disposition of the metal oxynitride layer 110, a high oxygen content region is formed between the variable resistance layer 104 and the second sublayer 112. The region can be used as an oxygen diffusion barrier layer to prevent oxygen ions from entering the second sublayer 112 during the repeat writing process. As a result, the issue above can be alleviated.

Another common issue of the resistive random access memory is that the first sublayer is generally formed by metal, and the diffusion rate of oxygen ions in those metal materials is relatively high. Even in room temperature, a certain chance exists for oxygen ions to return back into the variable resistance layer through diffusion. As soon as excessive oxygen ions return to the variable resistance layer and are recombined with oxygen vacancies, the conductive filaments may become severed such that the device cannot be maintained in a low resistance state, which is the issue of "HTDR fail".

For the solution to the issue, please refer to FIG. 4. Although the material of each of the first sublayer 108 and the first sublayer 208 is the same, the oxygen content in the first sublayer 108 is higher than the oxygen content in the first sublayer 208. This is because in the fabrication process of the resistive random access memory, the film layers may be affected by a high-temperature process after being formed, such that oxygen ions are diffused between adjacent film layers. In the known resistive random access memory, oxygen ions are diffused into the first sublayer 208 from the variable resistance layer 204; and in the resistive random access memory of the invention, oxygen ions are diffused into the first sublayer 108 from the variable resistance layer 104 and the metal oxynitride layer 110. Since there are more sources of oxygen ions, the oxygen content in the first sublayer 108 is higher than the oxygen content in the first sublayer 208. For instance, if the material of the first sublayer is Ti, then the number ratio of oxygen/titanium in the first sublayer 108 may be about 0.65, and the number ratio of oxygen/titanium in the first sublayer 208 may be about 0.35. Moreover, the number ratio of nitrogen/titanium is substantially the same for both.

The inventors discovered that, in a metal layer containing oxygen, the higher the oxygen concentration, the lower the diffusion rate of oxygen ions. Therefore, the diffusion rate of oxygen ions in the first sublayer 108 is lower than the diffusion rate of oxygen ions in the first sublayer 208. In other words, in comparison to prior art, in the resistive random access memory of the invention, the probability of severed conductive filaments caused by oxygen ions diffusing back to the variable resistance layer 104 by heat disturbance is reduced. That is, the resistive random access memory of the invention has better thermal stability. It should be mentioned here that, provided the metal oxynitride layer 110 is disposed between the first sublayer 108 and the second sublayer 112, the above effect can be achieved. However, if the metal oxynitride layer 110 is composed of O-rich metal oxynitride (atomic ratio of oxygen is about 45% to 60%), then the effect is more significant.

Based on the above, the invention provides a resistive random access memory and a method of fabricating the same, wherein a metal oxynitride layer is disposed between electrode layers. The metal oxynitride layer is used as an oxygen diffusion barrier layer limiting the movement of oxygen ions to the variable resistance layer and the region between the variable resistance layer and the metal oxynitride layer. At the same time, when the resistive random access memory is in a low resistance state thereof, the metal oxynitride layer can also reduce the probability of oxygen ions diffusing back to the variable resistance layer, thereby increasing the HTDR of the resistive random access memory.

Although the invention has been described with reference to the above exemplary embodiments, the invention is not limited thereto. It will be apparent to one of the ordinary skill in the art that modifications to the described embodiments may be made without departing from the spirit of the invention. Accordingly, the scope of the invention is defined by the attached claims and not by the above detailed descriptions.

What is claimed is:

1. A resistive random access memory, comprising a first electrode layer, a second electrode layer, and a variable resistance layer disposed between the first electrode layer and the second electrode layer, wherein the second electrode layer comprises a first sublayer, a second sublayer, and a conductive metal oxynitride layer disposed between the first sublayer and the second sublayer.

2. The resistive random access memory of claim 1, wherein a metal in the metal oxynitride layer is any one selected from the group consisting of tantalum, titanium, tungsten, hafnium, nickel, aluminum vanadium, cobalt, zirconium, and silicon.

3. The resistive random access memory of claim 1, wherein an atomic ratio of each of nitrogen and oxygen in the metal oxynitride layer is respectively 5% to 30% and 20% to 60%.

4. The resistive random access memory of claim 3, wherein an atomic ratio of oxygen in the metal oxynitride layer is 45% to 60%.

5. The resistive random access memory of claim 1, wherein the metal oxynitride layer has a polycrystalline structure.

6. The resistive random access memory of claim 1, wherein a thickness of the metal oxynitride layer is between 5 nm and 30 nm.

7. The resistive random access memory of claim 1, wherein the first sublayer is in contact with the variable resistance layer, a material of the first sublayer comprises titanium, and a number ratio of oxygen/titanium in the first sublayer is greater than 0.5.

8. The resistive random access memory of claim 7, wherein a material of the second sublayer is selected from the group consisting of titanium nitride, thallium nitride, platinum, iridium, and graphite.

9. A method of fabricating a resistive random access memory, comprising:
   forming a first electrode layer and a second electrode layer on a substrate; and
   forming a variable resistance layer between the first electrode layer and the second electrode layer, wherein the second electrode layer comprises a first sublayer, a conductive metal oxynitride layer, and a second sublayer disposed on the variable resistance layer in sequence.

10. The method of claim 9, wherein the first sublayer comprises titanium, and the method further comprises performing a heating step so as to diffuse oxygen in the metal oxynitride layer into the first sublayer such that a number ratio of oxygen/titanium in the first sublayer is greater than 0.5.

* * * * *